US011068078B2

(12) United States Patent
Lee et al.

(10) Patent No.: US 11,068,078 B2
(45) Date of Patent: *Jul. 20, 2021

(54) SYSTEM AND METHOD FOR DETECTING HAND GESTURE

(71) Applicant: HTC Corporation, Taoyuan (TW)

(72) Inventors: Lo-Chien Lee, Taoyuan (TW); Jing-Lung Wu, Taoyuan (TW); Jung-Sen Yang, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/893,449

(22) Filed: Jun. 5, 2020

(65) Prior Publication Data

US 2020/0301520 A1 Sep. 24, 2020

Related U.S. Application Data

(63) Continuation of application No. 15/717,967, filed on Sep. 28, 2017, now Pat. No. 10,712,835.

(Continued)

(51) Int. Cl.
*G06F 3/0346* (2013.01)
*H03K 17/96* (2006.01)
(Continued)

(52) U.S. Cl.
CPC ............ *G06F 3/0346* (2013.01); *G06F 3/011* (2013.01); *G06F 3/017* (2013.01); *G06F 3/0304* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 6,724,366 B2* | 4/2004 | Crawford | G06F 3/03547 345/156 |
| 2005/0162402 A1* | 7/2005 | Watanachote | G06F 3/04886 345/173 |

(Continued)

FOREIGN PATENT DOCUMENTS

| | | |
|---|---|---|
| CN | 101901054 A | 12/2010 |
| CN | 102216883 A | 10/2011 |

(Continued)

OTHER PUBLICATIONS

Corresponding Taiwan office action dated Apr. 24, 2018.
Corresponding Chinese office action dated Jun. 28, 2019.

*Primary Examiner* — Van N Chow
(74) *Attorney, Agent, or Firm* — CKC & Partners Co., LLC (57) ABSTRACT

Present disclosure relates to a system for detecting hand gesture and a method thereof. The system comprises a hand-held controller and a computing application. The hand-held controller includes a plurality of finger detectors. The finger detectors are configured to obtain finger positions. The computing application, executed by a processor, is configured to retrieve a spatial vector of the hand-held controller. The computing application is also configured to retrieve the finger positions from the hand-held controller. The spatial vector of the hand-held controller and the finger positions are provided to illustrate a simulated hand gesture.

19 Claims, 10 Drawing Sheets

Related U.S. Application Data (60) Provisional application No. 62/404,775, filed on Oct. 6, 2016.

(51) Int. Cl.
*G06F 3/01* (2006.01)
*G06F 3/0354* (2013.01)
*G06F 3/03* (2006.01)

(52) U.S. Cl.
CPC ......... *G06F 3/03547* (2013.01); *H03K 17/96* (2013.01); *H03K 17/9625* (2013.01); *G06F 2203/04101* (2013.01)

(56) References Cited

U.S. PATENT DOCUMENTS

| | | | |
|---|---|---|---|
| 2005/0275625 A1 | 12/2005 | Koenig | |
| 2013/0082922 A1* | 4/2013 | Miller | G06F 3/014 |
| | | | 345/156 |
| 2015/0348327 A1* | 12/2015 | Zalewski | G06T 15/00 |
| | | | 345/419 |
| 2016/0054798 A1* | 2/2016 | Messingher | G06F 3/016 |
| | | | 345/156 |
| 2016/0132189 A1* | 5/2016 | Choi | G06F 1/163 |
| | | | 345/633 |
| 2019/0034072 A1* | 1/2019 | Chiu | G06F 3/017 |
| 2019/0146653 A1* | 5/2019 | Ikuta | G09G 3/002 |
| | | | 715/863 |

FOREIGN PATENT DOCUMENTS

| | | |
|---|---|---|
| CN | 104162274 A | 11/2014 |
| TW | 200709831 A | 3/2007 |
| TW | 200846061 A | 12/2008 |
| TW | 201109068 A | 3/2011 |
| TW | 201219093 A | 5/2012 |
| TW | 201633104 A | 9/2016 |
| TW | 201635098 A | 10/2016 |

\* cited by examiner

SYSTEM AND METHOD FOR DETECTING HAND GESTURE

CROSS-REFERENCE TO RELATED APPLICATION

The present application is a continuation application of the U.S. application Ser. No. 15/717,967, filed Sep. 28, 2017, which claims priority to U.S. Provisional Application Ser. No. 62/404,775, filed Oct. 6, 2016, all of which are herein incorporated by reference.

BACKGROUND

Field of Invention

Present disclosure relates to a system and a method for providing a simulated environment. More particularly, the present disclosure relates to a system and a method for providing a simulated environment to multiple users.

Description of Related Art

Applications of simulated environments, such as virtual reality and augmented reality, are considerably useful in many approaches. As can be seen from the market, simulated environments are mostly provided in games or demonstrating occasions. In these occasions, there are many fashions may be used to represent a first or a hand in the simulated environments, such as detecting user's hands by hand held controllers and illustrating corresponding simulated limbs in the simulated environments. However, most of the systems are of less concern about delicate palm or finger gesture representation. Most of current systems may only simulate a wide-opened palm or a clenched first by determining whether a physical button of the hand held controller is triggered. It is apparent that current systems are very limited in the variety of hand gesture representation. Therefore, a more adaptive and straightforward system for providing simulated hand gestures in simulated environments is required.

SUMMARY

The disclosure provides a system for detecting hand gesture. The system comprises a hand-held controller and a computing application. The hand-held controller further comprises a plurality of finger detectors, wherein the finger detectors are configured to obtain finger positions. The computing application is executed by a processor. The computing application is configured to retrieve the finger positions from the hand-held controller, wherein the spatial vector of the hand-held controller and the finger positions are provided to illustrate a simulated hand gesture.

Another aspect of present disclosure is to provide a method for detecting hand gesture. The method comprises following steps: obtaining, by a plurality of finger detectors of a hand-held controller, finger positions; retrieving, by a computing application executed by a processor, a spatial vector of the hand-held controller; retrieving, by the computing application, the finger positions from the hand-held controller; and providing, by the computing application, to illustrate a simulated hand gesture according to the spatial vector of the hand-held controller and the finger positions.

Another aspect of present disclosure is to provide a system for detecting hand gesture and providing a simulated scenario. The system comprises a head-mounted display, a hand-held controller and a computing application. The head-mounted display is configured for displaying the simulated scenario. The hand-held controller comprises a plurality of finger detectors, wherein the finger detectors are configured to obtain finger positions. The computing application is executed by a processor. The computing application is configured to retrieve a spatial vector of the hand-held controller, and to retrieve the finger positions from the hand-held controller, wherein the spatial vector of the hand-held controller and the finger positions are provided to illustrate a simulated hand gesture of an avatar in the simulated scenario.

The disclosure also provides a system for detecting hand gesture and providing a simulated scenario. The system comprises a head-mounted display, a hand-held controller and a computing device.

It is to be understood that both the foregoing general description and the following detailed description are by examples, and are intended to provide further explanation of the disclosure as claimed.

BRIEF DESCRIPTION OF THE DRAWINGS

Present disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

In the following description and claims, the terms "coupled" and "connected", along with their derivatives, may be used. In particular embodiments, "connected" and "coupled" may be used to indicate that two or more elements are in direct physical or electrical contact with each other, or may also mean that two or more elements may be in indirect contact with each other. "Coupled" and "connected" may still be used to indicate that two or more elements cooperate or interact with each other.

Figures 1A, 1B:
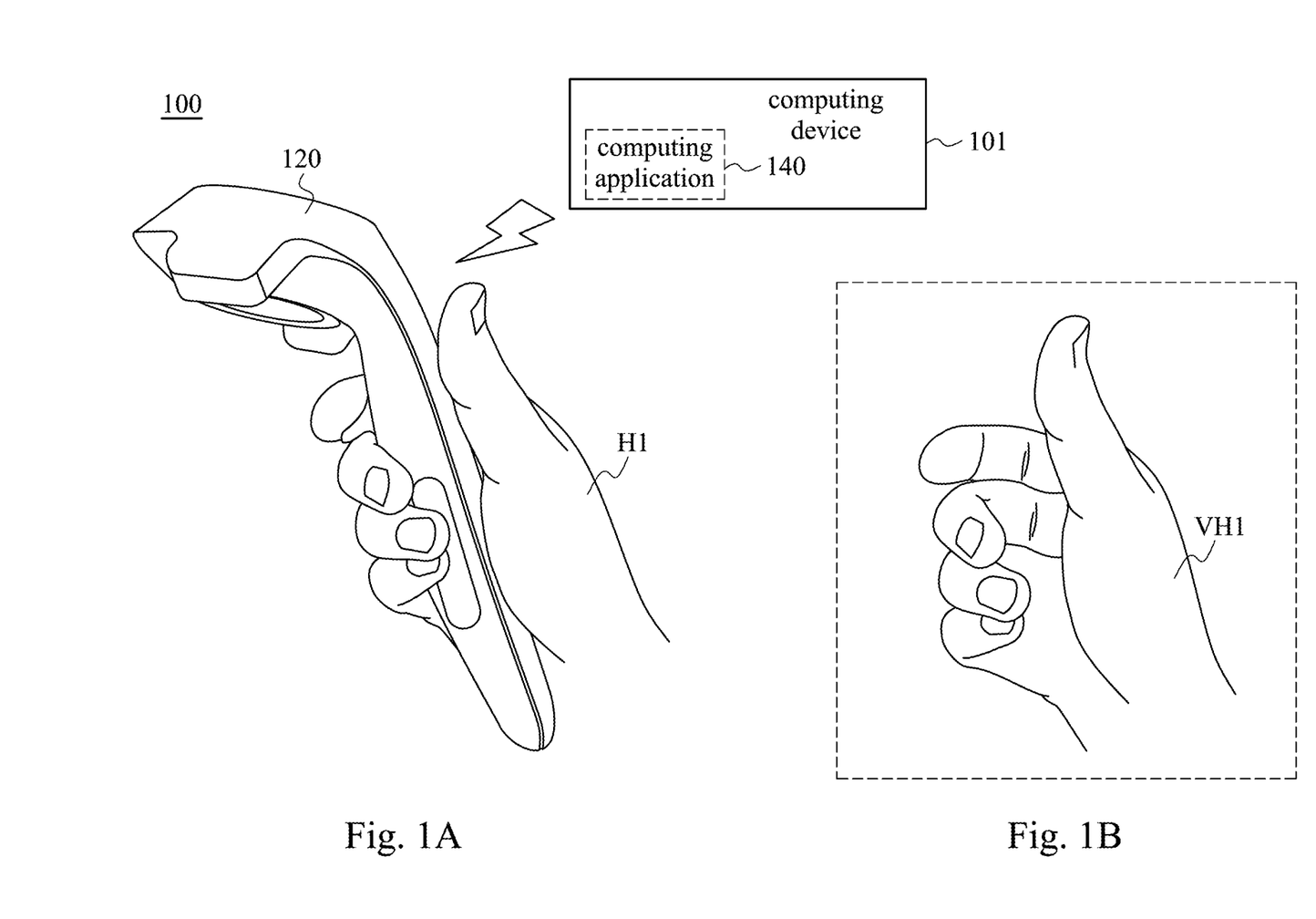
FIG. 1A is a schematic diagram of a system for detecting hand gesture according to some embodiments of the present disclosure.
FIG. 1B is a schematic diagram of a system for detecting hand gesture according to the embodiments of FIG. 1A.

FIG. 1A is a schematic diagram of a system for detecting hand gesture according to some embodiments of the present disclosure. As illustrated in FIG. 1A, in one embodiment, the system 100 for detecting hand gesture comprises a hand-held controller 120 and a computing device 101, wherein the hand-held controller 120 and the computing device 101 are in communication with each other. A computing application 140 is executed by a processor (not shown in FIG. 1A) of the computing device 101 to associate with the hand-held controller 120. As shown in FIG. 1A, the hand-held controller 120 is held by one hand H1 of user. A plurality of finger detectors is configured on the hand-held controller 120 to obtain finger positions of the hand H1 of user. The finger detectors are configured in several detecting areas whereon the fingers of user may place in a normal case. In some embodiments, the processor may be a CPU, GPU, or some control unit configured on the computing device 101, and the computing application 140 may be software or firmware applied by the processor to associate with the hand-held controller 120.

In the embodiment shown in FIG. 1A, the hand-held controller 120 is held by the right hand of the user. The system is able to detect the hand gesture on the right hand of the user. However, the disclosure is not limited thereto. In another embodiment, when the hand-held controller 120 is held by the left hand of the user, the system is able to detect the hand gesture on the left hand of the user.

In still another embodiment, the system includes a pair of the hand-held controllers 120 (not shown in FIG. 1A), and the hand-held controllers 120 are hold respectively by both hands of the user. In this embodiment, the system is able to detect the hand gestures on both hands of the user.

In the embodiment, the finger positions may include two kinds of parameters, which are finger distances and finger angles. The finger distance is directed to a distance from at least a predetermined point on one finger of user to a detecting margin of one of the finger detectors. For example, if an index finger detector is configured on a first detecting area for index finger detection, the detecting margin of the index finger detector is a first point on the surface of the first detecting area. In this case, an index finger distance may be determined by how far the index finger tip of user is away from the first point. The finger angle is directed to an angle that a predetermined point on one finger of user is departed from an axis extended from one of the finger detectors. For example, if the index finger detector is configured on the first detecting area for index finger detection, the detecting margin of the index finger detector is the first point on the surface of the first detecting area. An index finger angle may be determined by the angle between an axis extended from the first point and the line from the index finger tip of user to the first point.

In some embodiments, the finger distance is directed to multiple distances from various predetermined points on one finger of a user to a detecting margin of one of the finger detectors, and the finger angle is directed to multiple angles that various predetermined points on one finger of user are departed from an axis extended from one of the finger detectors.

In the embodiment, as illustrated in FIG. 1A, since the hand-held controller 120 is held by the hand H1 of user, the hand-held controller 120 may detect finger positions of the hand H1 of user. The finger positions may be sent, by the hand-held controller 120, to the computing application 140. The computing application 140 runs on the computing device 101 may receive the finger positions. The computing application 140 may also retrieve a spatial vector of the hand-held controller 120, wherein the spatial vector of the hand-held controller 120 comprises a position of the hand-held controller 120 and an orientation of the hand-held controller 120. In some embodiments, the position and the orientation of the hand-held controller 120 may be detected by an inertial measurement unit of the hand-held controller 120. In some embodiments, the position and the orientation of the hand-held controller 120 may be detected by an individual optical measurement unit (not shown in FIG. 1) associated with the hand-held controller 120. The computing application 140 is therefore able to retrieve the spatial vector from the hand-held controller 120. The spatial vector of the hand-held controller 120 and the finger positions are provided to illustrate a simulated hand gesture corresponding to the user in a simulated scenario, herein the simulated scenario may refer to a scenario presented in a virtual reality environment or a scenario presented in an augmented reality environment, for example.

FIG. 1B is a schematic diagram of a system for detecting hand gesture according to the embodiments of FIG. 1A. As shown in FIG. 1B, a simulated hand gesture VH1 corresponding to user is illustrated in the simulated scenario, wherein the simulated hand gesture VH1 is in consistent with the gesture performing by the hand H1 of user in the real world. The simulated hand gesture VH1 may be illustrated, by an application executed on the computing device 101, according to the spatial vector of the hand-held controller 120 and the finger positions detected by the hand-held controller 120. The simulated hand gesture VH1 may be in connection with a body of an avatar corresponding to user in the simulated scenario, wherein the avatar is not shown in the figure. Therefore, by utilizing the system 100 for detecting hand gesture of present disclosure, the gesture performing by the hands of a user may be duplicated to the simulated environment. Through this approach, more and much complicated hand gesture may be provided in the simulated environment.

Figure 2A:
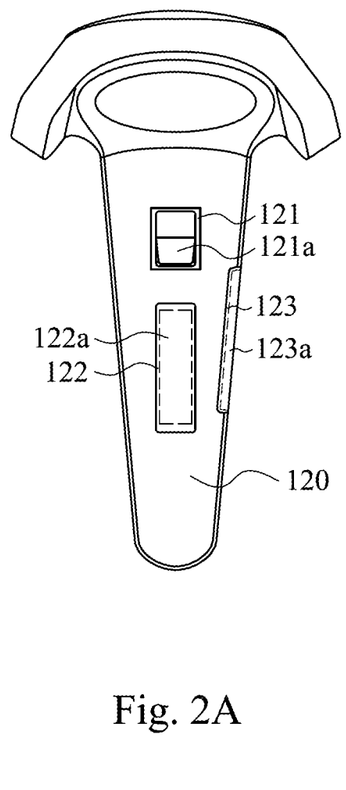
FIG. 2A is a schematic diagram of a system for detecting hand gesture according to some embodiments of present disclosure.

FIG. 2A is a schematic diagram of a system for detecting hand gesture according to the embodiments of present disclosure. In some embodiment, a first side of the hand-held controller 120 is configured as shown in FIG. 2A, wherein the first side incudes a front side and part of a lateral side of the hand-held controller 120. Three detecting areas are configured on the surface of the front side of the hand-held controller 120, which are a first detecting area 121, a second detecting area 122 and a third detecting area 123. A first finger detector 121a is configured in the first detecting area 121 to detect an index finger position of a user. A second finger detector 122a is configured in the second detecting area 122 to detect a first middle finger position, a first ring finger position and a first little finger of the user. A third finger detector 123a is configured in the third detecting area 123 to detect a second middle finger position, a second ring finger position and a second little finger of the user.

In some embodiments, the third finger detector 123a may be a touch detector configured to detect whether finger contacts are applied thereon. For instance, if the tip of the middle finger is in contact with the third detecting area 123, the second middle finger position detected by the third finger detector 123a may be represented as "being touched". If the tip of the little finger is not in contact with the third detecting area 123, the second little finger position detected by the third finger detector 123a may be represented as "being untouched". In some embodiments, the second finger detector 122a may be a proximity detector configured to detect the distances between the surface of the second detecting area 122 and the middle finger, or the ring finger, or the little finger of the user. For instance, if the second knuckle of the middle finger is detected in a first distance from the second detecting area 122, the first middle finger position detected by the second finger detector 122a may be represented as "the second knuckle is away in a first distance", and if the second knuckle of the little finger is detected in a second distance from the second detecting area 122, the first little finger position detected by the second finger detector 122a may be represented as "the second knuckle is away in a second distance". The finger positions detected by the second finger detector 122a and the finger position detected by the third finger detector 123a may be combined as a whole as a middle finger position, a ring finger position and a little finger position.

In some embodiments, the first finger detector 121a may be a proximity detector configured to detect the distances between the surface of the first detecting area 121 and the index finger of the user. For instance, if the tip of the index finger is detected in a third distance from the first detecting area 121, the index finger position detected by the first finger detector 121a may be represented as "the tip is away in a third distance". And if the second knuckle of the index finger is being detected as contacting to the first detecting area 121, the index finger position detected by the first finger detector 121a may be represented as "the index finger is in a marginal distance". In this way, the first finger detector 121a, the second finger detector 122a and the third finger detector 123a may detect the index finger position, the middle finger position, the ring finger position and the little finger of the user.

Figure 2B:
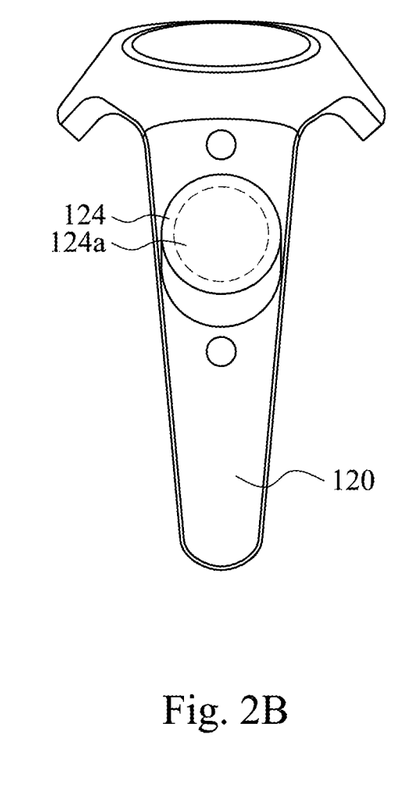
FIG. 2B is a schematic diagram of a system for detecting hand gesture according to the embodiments of FIG. 2A.

FIG. 2B is a schematic diagram of a system for detecting hand gesture according to the embodiments of FIG. 2A. In some embodiment, a second side of the hand-held controller 120 is configured as shown in FIG. 2B, wherein the second side incudes a rear side of the hand-held controller 120. As can be seen, a fourth detecting area 124 is configured on the rear surface of the hand-held controller 120. A fourth finger detector 124a, which may be a proximity detector, is configured in the fourth detecting area 124 to detect a distance between the surface of the fourth detecting area 124 and the thumb of the user. For example, if the tip of the thumb is detected in a fourth distance from the fourth detecting area 124, the thumb position detected by the fourth finger detector 124a may be represented as "the tip is away in a forth distance", and if the tip of the thumb is detected as in contact with the fourth detecting area 124, the thumb position detected by the fourth finger detector 124a may be represented as "the tip is in a marginal distance". In this way, the fourth finger detector 124a may detect the thumb position of the user. In some embodiments, the position and the orientation of the hand-held controller 120 may be detected by an inertial measurement unit (not shown in FIG. 2B) of the hand-held controller 120.

As shown in FIG. 2A and FIG. 2B, the first finger detector 121a, the second finger detector 122a, the third finger detector 123a and the fourth finger detector 124a configured on the hand-held controller 120 may detect finger positions of the user in a high sensitivity. Moreover, since the first finger detector 121a, the second finger detector 122a, the third finger detector 123a and the fourth finger detector 124a are proximity detectors, when they are detecting the distances between themselves to the fingers, the angles between the axes extended from these detectors and the lines from specific points to these detectors may be detected as well. These finger angles are also collected as a part of the finger positions. When a corresponding computing application (not shown) receives the finger positions from the hand-held controller 120, a complicate simulated hand gesture corresponding to the finger positions may be performed by the avatar of the user. However, the configuration of the embodiments on FIG. 2A and FIG. 2B are only exemplary cases, each of the first detecting area 121, the second detecting area 122, the third detecting area 123 and the fourth detecting area 124 may configured with more than a single type of detectors to detect more complicate finger positions. For instance, the first finger detector 121a configured in the first detecting area 121 may be a combination of proximity detector and a mechanical switch. For instance, the fourth finger detector 124a configured in the fourth detecting area 124 may be a combination of proximity detector and pressure detector. In that way, the fourth finger detector 124a may not only detect the distance of the thumb finger but also the pressure applied by the thumb finger. Therefore, the finger positions may include more information in consistent with the true status of the user's fingers.

Figure 3A:
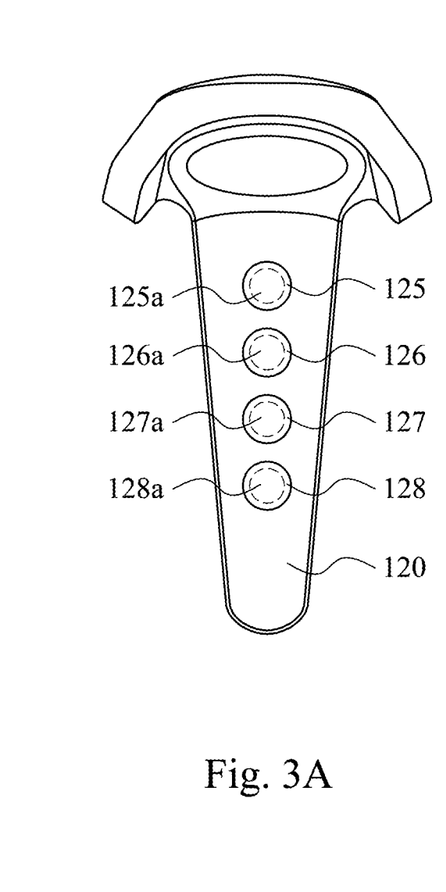
FIG. 3A is a schematic diagram of a system for detecting hand gesture according to some embodiments of present disclosure.

FIG. 3A is a schematic diagram of a system for detecting hand gesture according to the embodiments of present disclosure. In some embodiment, a first side of the hand-held controller 120 is configured as shown in FIG. 3A, wherein the first side incudes a front side of the hand-held controller 120. Four detecting areas are configured on the surface of the front side of the hand-held controller 120, which are a fifth detecting area 125, a sixth detecting area 126, a seventh detecting area 127 and an eighth detecting area 128. A fifth finger detector 125a is configured in the fifth detecting area 125 to detect an index finger position of a user. A sixth finger detector 126a is configured in the sixth detecting area 126 to detect a middle finger position of the user. A seventh finger detector 127a is configured in the seventh detecting area 127 to detect a ring finger position of the user. An eighth finger detector 128a is configured in the eighth detecting area 128 to detect a little finger of the user.

In some embodiments, the fifth finger detector 125a may be a proximity detector configured to detect the distance between the surface of the fifth detecting area 125 and the index finger. For instance, if the second knuckle of the index finger is detected in a first distance from the fifth detecting area 125, the index finger position detected by the fifth finger detector 125a may be represented as "the second knuckle is away in a first distance". In a same manner, the sixth finger detector 126a may be a proximity detector configured to detect the distance between the surface of the sixth detecting area 126 and the middle finger. The seventh finger detector 127a may be a proximity detector configured to detect the distance between the surface of the seventh detecting area 127 and the ring finger. The eighth finger detector 128a may be a proximity detector configured to detect the distance between the surface of the eighth detecting area 128 and the little finger. It should be understood that the fifth finger detector 125a, the sixth finger detector 126a, the seventh finger detector 127a and the eighth finger detector 128a respectively configured in the fifth detecting area 125, the sixth detecting area 126, the seventh detecting area 127 and the eighth detecting area 128 are merely examples, a combination of several types of detectors may be applied in these detecting areas to detect much complicated finger positions of the user. The configuration of the rear side of the hand-held controller 120 is similar to aforesaid embodiments of hand-held controller 120 shown in FIG. 2B, and not repeated here again.

Figure 3B:
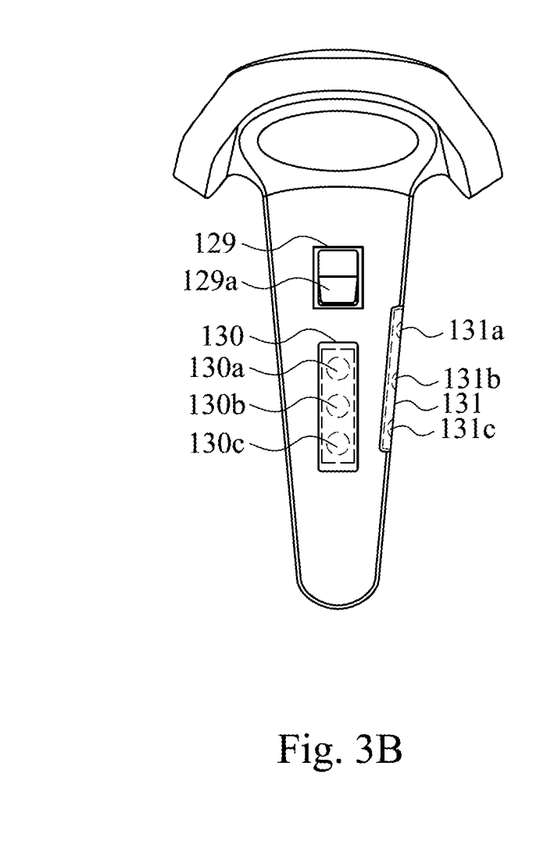
FIG. 3B is a schematic diagram of a system for detecting hand gesture according to some embodiments of present disclosure.

FIG. 3B is a schematic diagram of a system for detecting hand gesture according to the embodiments of present disclosure. In some embodiment, a first side of the hand-held controller 120 is configured as shown in FIG. 3B, wherein the first side incudes a front side of the hand-held controller 120. Three detecting areas are configured on the surface of the front side of the hand-held controller 120, which are a ninth detecting area 129, a tenth detecting area 130 and a eleventh detecting area 131. A ninth finger detector 129a is configured in the ninth detecting area 129 to detect an index finger position of a user. Three sub finger detectors 130a-130c are configured in the tenth detecting area 130 to detect a third middle finger position, a third ring finger position and a third little finger position of the user. The sub finger detector 130a is configured to detect the third middle finger position. The sub finger detector 130b is configured to detect the third ring finger position. The sub finger detector 130c is configured to detect the third little finger position.

In the same manner, in the embodiment, three sub finger detectors 131a-131c are configured in the eleventh detecting area 131 to detect a fourth middle finger position, a fourth ring finger position and a fourth little finger position of the user. The sub finger detector 131a is configured to detect the fourth middle finger position. The sub finger detector 131b is configured to detect the fourth ring finger position. The sub finger detector 131c is configured to detect the fourth little finger position. The third middle finger position and the fourth middle finger position may be combined as a middle finger position. The third ring finger position and the fourth ring finger position may be combined as a ring finger position. The third little finger position and the fourth little finger position may be combined as a little finger position. Similar to aforementioned embodiments, the hand-held controller 120 may still detect all the finger positions despite its configuration is slightly different. The detectors in the embodiment may also be a combination of several types of detectors to detect much complicated finger positions of the user. The configuration of the rear side of the hand-held controller 120 is similar to aforesaid embodiments of hand-held controller 120 shown in FIG. 2B, and not repeated here again.

Figure 3C:
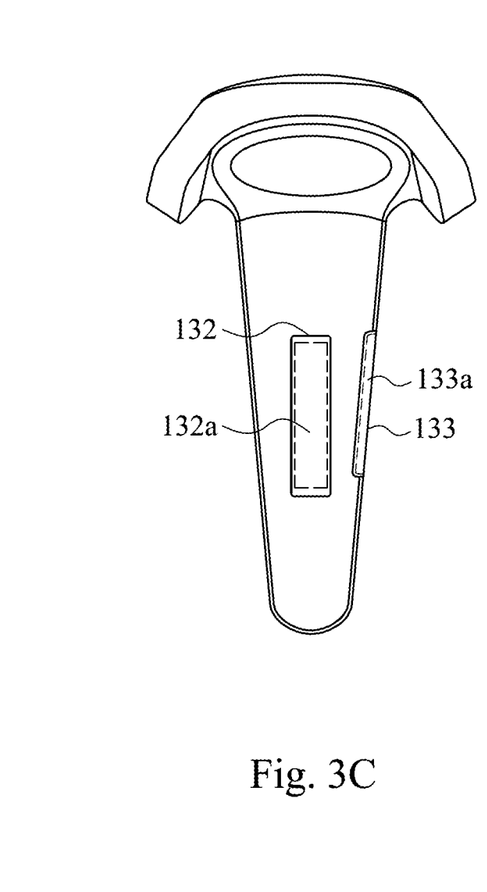
FIG. 3C is a schematic diagram of a system for detecting hand gesture according to some embodiments of present disclosure.

FIG. 3C is a schematic diagram of a system for detecting hand gesture according to the embodiments of present disclosure. In some embodiment, a first side of the hand-held controller 120 is configured as shown in FIG. 3C, wherein the first side incudes a front side of the hand-held controller 120. Two detecting areas are configured on the surface of the front side of the hand-held controller 120, which are a twelfth detecting area 132 and a thirteenth detecting area 133. A twelfth finger detector 132a is configured in the twelfth detecting area 132 to detect a fifth index finger position, a fifth middle finger position, a fifth ring finger position and a fifth little finger position of a user. A thirteenth finger detector 133a is configured in the thirteenth detecting area 133 to detect a sixth index finger position, a sixth middle finger position, a sixth ring finger position and a sixth little finger position of the user.

In the same manner, in the embodiment, the fifth index finger position and the sixth index finger position may be combined as an index finger position. The fifth middle finger position and the sixth middle finger position may be combined as a middle finger position. The fifth ring finger position and the sixth ring finger position may be combined as a ring finger position. The fifth little finger position and the sixth little finger position may be combined as a little finger position. Similar to aforementioned embodiments, the hand-held controller 120 may detect all the finger positions despite its configuration is slightly different. The detectors in the embodiment may also be a combination of several types of detectors to detect much complicated finger positions of the user. The configuration of the rear side of the hand-held controller 120 is similar to aforesaid embodiments of hand-held controller 120 shown in FIG. 2B, and not repeated here again.

Figure 4A:
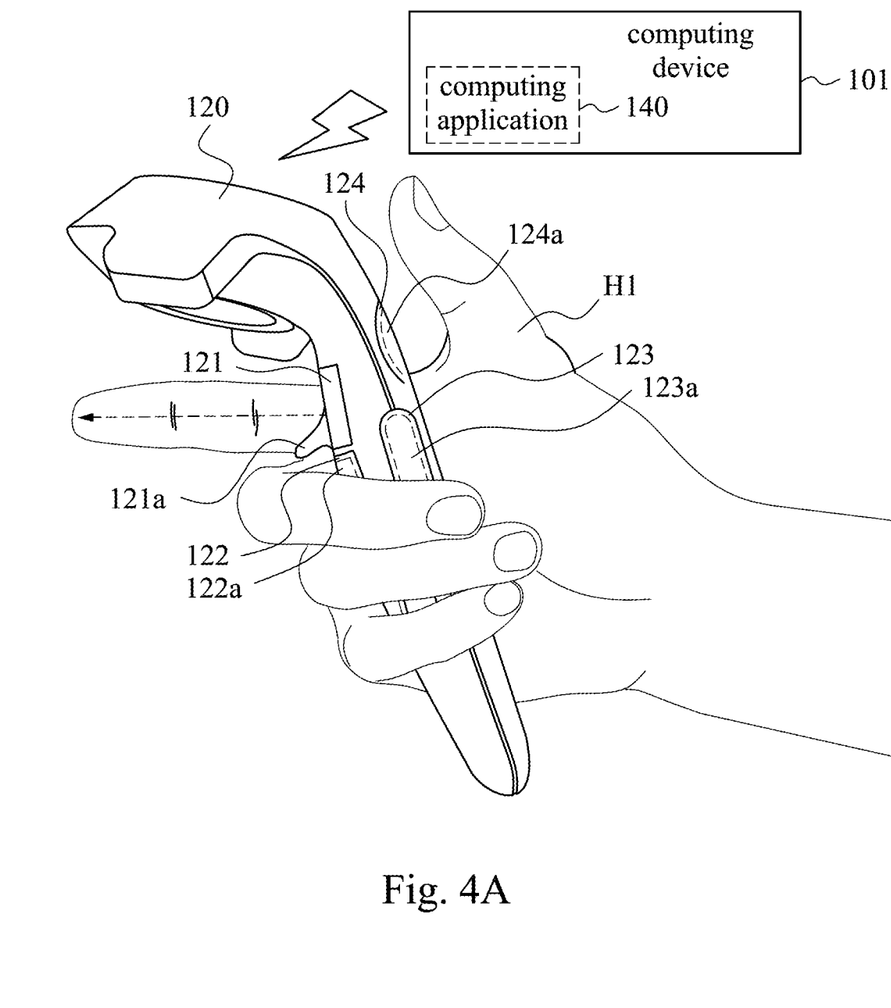
FIG. 4A is a schematic diagram of a system for detecting hand gesture according to some embodiments of present disclosure.

FIG. 4A is a schematic diagram of a system for detecting hand gesture according to the embodiments of present disclosure. In the embodiment, a hand-held controller 120 is held by the hand H1 of user. The configuration of the hand-held controller 120 is identical to the one as illustrated in FIG. 2A and FIG. 2B of present disclosure. As shown in FIG. 4A, the first detecting area 121 is configured to detect, via a first finger detector 121a, the index finger position of the hand H1. The second finger detector 122a is configured in the second detecting area 122 to detect the first middle finger position, the first ring finger position and the first little finger position of the hand H1. The third finger detector 123a is configured in the third detecting area 123 to detect the second middle finger position, the second ring finger position and the second little finger position of the hand H1. The third finger detector 123a is mainly configured to detect the tips of the middle finger, the ring finger and the little finger. The fourth finger detector 124a is configured in the fourth detecting area 124 to detect the thumb position of the hand H1.

In the embodiment, the tip of the index finger of user may be detected in a first distance from the first detecting area 121. The tip of the index finger of user may also be detected in a first angle departing from an axis extended from the first detecting area 121. The first distance and the first angle are in combination as the index finger position, which indicates that the index finger of the hand H1 is pointing away from the palm of user. Since the middle finger, the ring finger and the little finger of the hand H1 are holding the hand-held controller 120, the second finger detector 122a may detect the first middle finger position, the first ring finger position and the first little finger position as these fingers are placed on the hand-held controller 120. As the same, the third finger detector 123a may detect the second middle finger position, the second ring finger position and the second little finger position as these fingers are placed on the hand-held controller 120. In the embodiment, the tip of the thumb of user may be detected in a second distance from the fourth detecting area 124. The tip of the thumb of user may also be detected in a second angle departing from an axis extended from the fourth detecting area 124. The second distance and the second angle are in combination as the thumb position, which indicates that the thumb of the hand H1 is also away from the palm of user. The index finger position, the thumb position, the first middle finger position, the first ring finger position, the first little finger position, the second middle finger position, the second ring finger position and the second little finger position may all be sent to the computing device 101. The spatial vector of the hand-held controller 120 may also be detected and be sent to the computing device 101. The computing application 140 executed by the computing device 101 may receive the spatial vector and the finger positions.

Figure 4B:
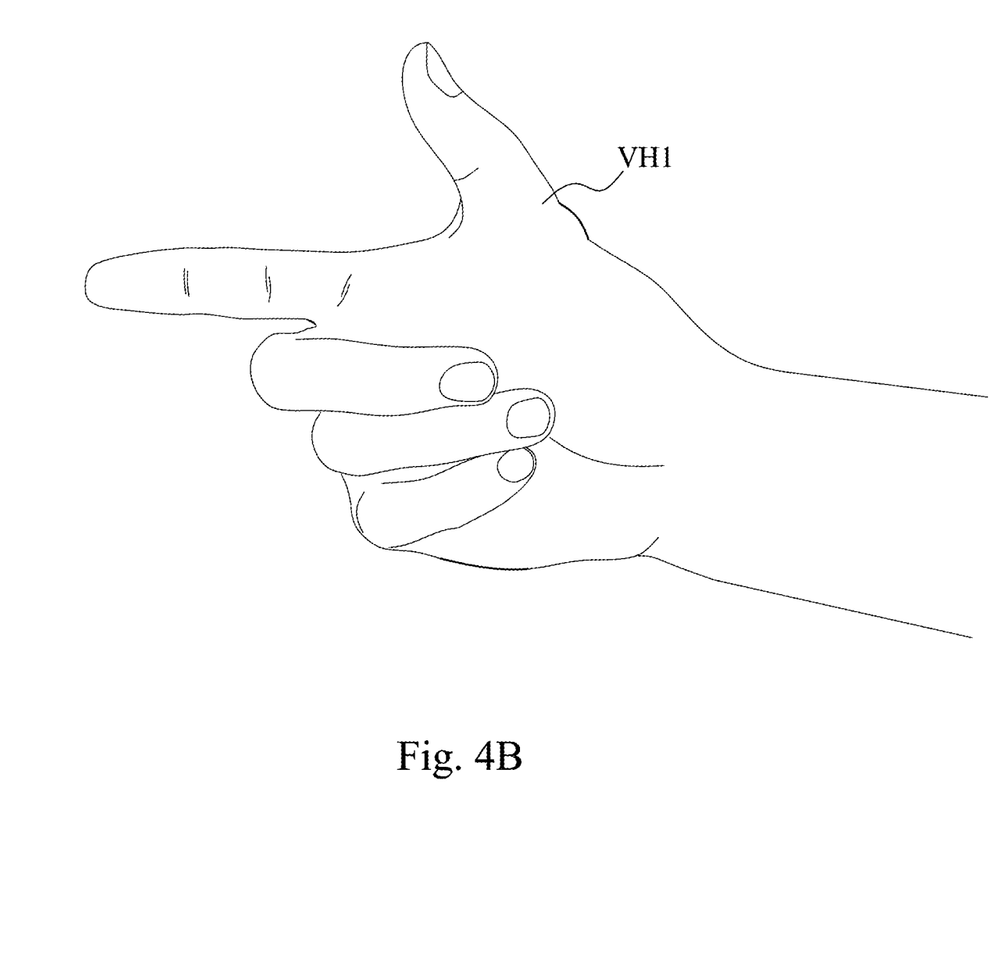
FIG. 4B is a schematic diagram of a system for detecting hand gesture according to the embodiments of FIG. 4A.

FIG. 4B is a schematic diagram of a system for detecting hand gesture according to the embodiments of FIG. 4A. In the embodiment, since the spatial vector of the hand-held controller 120 and the finger positions of the hand H1 of user are sent to the computing application 140, the computing application 140 may process the finger positions and the spatial vector to generate information accordingly. The information generated by the computing application 140 is provided to other applications to illustrate a simulated hand gesture VH1 according to the spatial vector and the finger positions in the simulated scenario. The simulated hand gesture VH1 is in consistent with the gesture performing by the hand H1 of user in the FIG. 4A. The simulated hand gesture VH1 is illustrated as that user is grasping with his middle finger, ring finger, little finger and keeping his index finger and thumb straight.

Figure 5A:
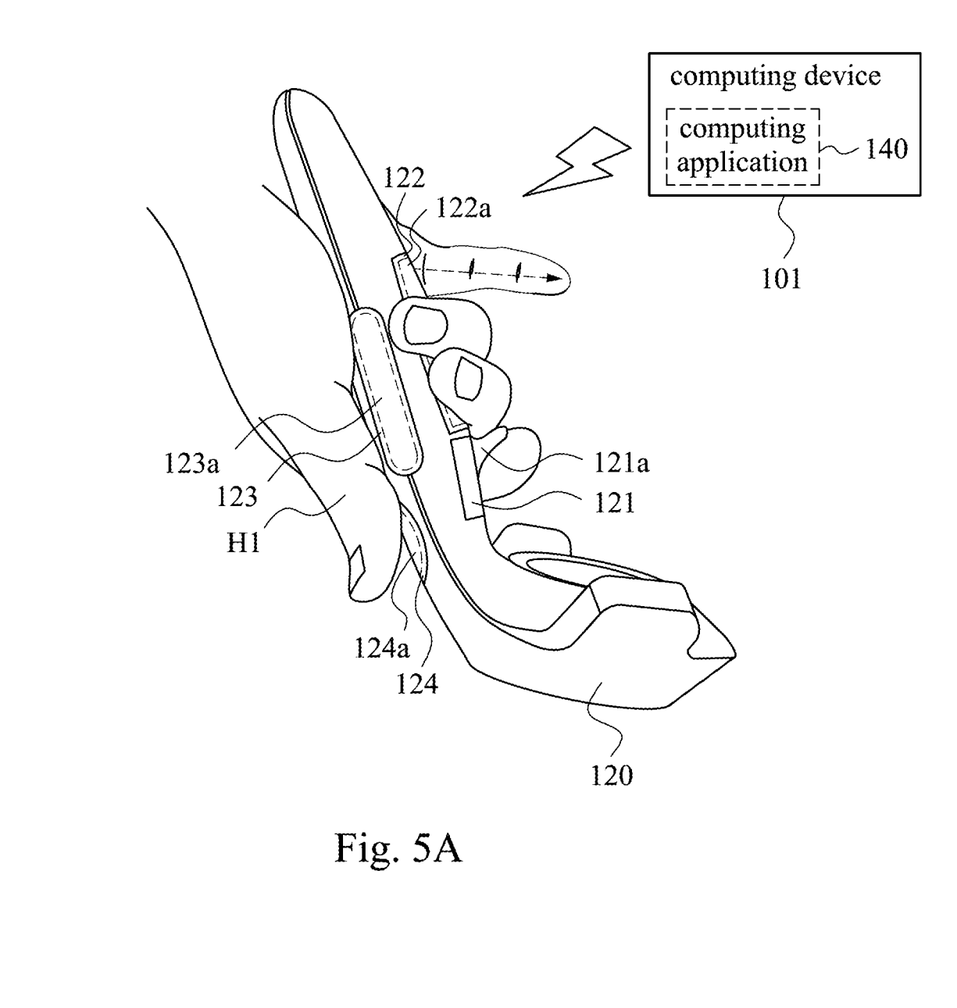
FIG. 5A is a schematic diagram of a system for detecting hand gesture according to some embodiments of present disclosure.

FIG. 5A is a schematic diagram of a system for detecting hand gesture according to the embodiments of present disclosure. In the embodiment, a hand-held controller 120 is also held by the hand H1 of user; however, the hand-held controller 120 is being held upside down. The configuration of the hand-held controller 120 is identical to the one as illustrated in FIG. 2A and FIG. 2B of present disclosure. Under this condition, an inertial measurement unit (not shown in FIG. 5A) configured in the hand-held controller 120 may retrieve a spatial vector of the hand-held controller 120, wherein the spatial vector indicates that the hand-held controller 120 is being held upside down and pointing toward an opposite direction compared to FIG. 4A. The hand-held controller 120 may still retrieve finger positions from user. As shown in FIG. 5A, the first detecting area 121 is configured to detect, via the first finger detector 121a, the index finger position of the hand H1. The second finger detector 122a is configured in the second detecting area 122 to detect the first middle finger position, the first ring finger position and the first little finger position of the hand H1.

The third finger detector 123a is configured in the third detecting area 123 to detect the second middle finger position, the second ring finger position and the second little finger position of the hand H1. The third finger detector 123a is mainly configured to detect the tips of the middle finger, the ring finger and the little finger. The fourth finger detector 124a is configured in the fourth detecting area 124 to detect the thumb position of the hand H1.

In the embodiment, the tip of the index finger of user may be detected as placed on the first finger detector 121a with a first angle departing from an axis extended from the first detecting area 121. The first finger detector 121a may detect the index finger position accordingly. As shown in FIG. 5A, the middle finger and the ring finger of the hand H1 are holding the hand-held controller 120. However, since the tips of the middle finger and the ring finger of the hand H1 are placed on the second detecting area 122, therefore the second finger detector 122a may detect the first middle finger position and the first ring finger position accordingly. The tip of the little finger of the hand H1 may be detected in a first distance from the second detecting area 122, which indicates that the little finger of the hand H1 is pointing away from the palm of user. In the embodiment, since the tips of the middle finger, the ring finger and the little finger are not placed on the third detecting area 123, the third finger detector 123a may detect the second middle finger position, the second ring finger position and the second little finger position as leaving the third detecting area 123. The fourth finger detector 124a configured in the fourth detecting area 124 may detect the thumb position as the thumb is placed on the fourth detecting area 124. The index finger position, the thumb position, the first middle finger position, the first ring finger position, the first little finger position, the second middle finger position, the second ring finger position and the second little finger position may be sent to the computing application 140 executed by the computing device 101. The spatial vector detected by the inertial measurement unit of the hand-held controller 120 may also be sent to the computing application 140.

Figure 5B:
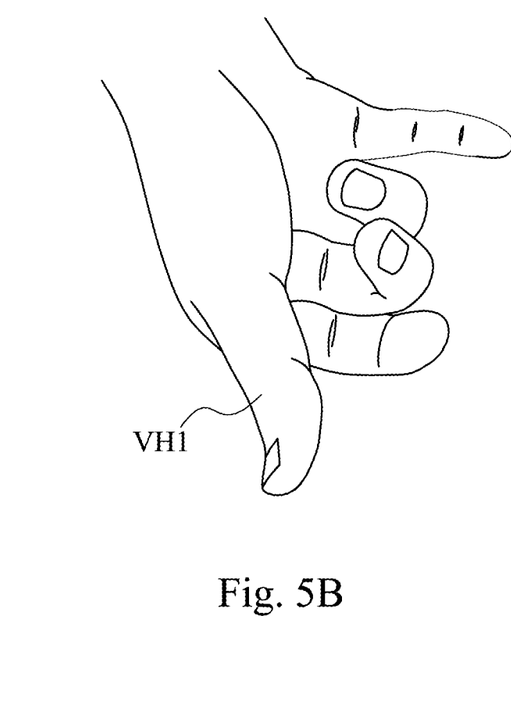
FIG. 5B is a schematic diagram of a system for detecting hand gesture according to the embodiments of FIG. 5A.

FIG. 5B is a schematic diagram of a system for detecting hand gesture according to the embodiments of FIG. 5A. In the embodiment, since the spatial vector of the hand-held controller 120 and the finger positions of the hand H1 of user are sent to the computing application 140, the computing application 140 may generate information according to the spatial vector and the finger positions. The information is provided to other applications to illustrate a simulated hand gesture VH1 according to the spatial vector and the finger positions in the simulated scenario. The simulated hand gesture VH1 shows an upside down hand in consistent with the gesture performing by the hand H1 of user in the FIG. 5A. The simulated hand gesture VH1 is illustrated as that user is grasping with his index finger, middle finger, ring finger and thumb, and keeping his little finger and straight.

Figure 6:
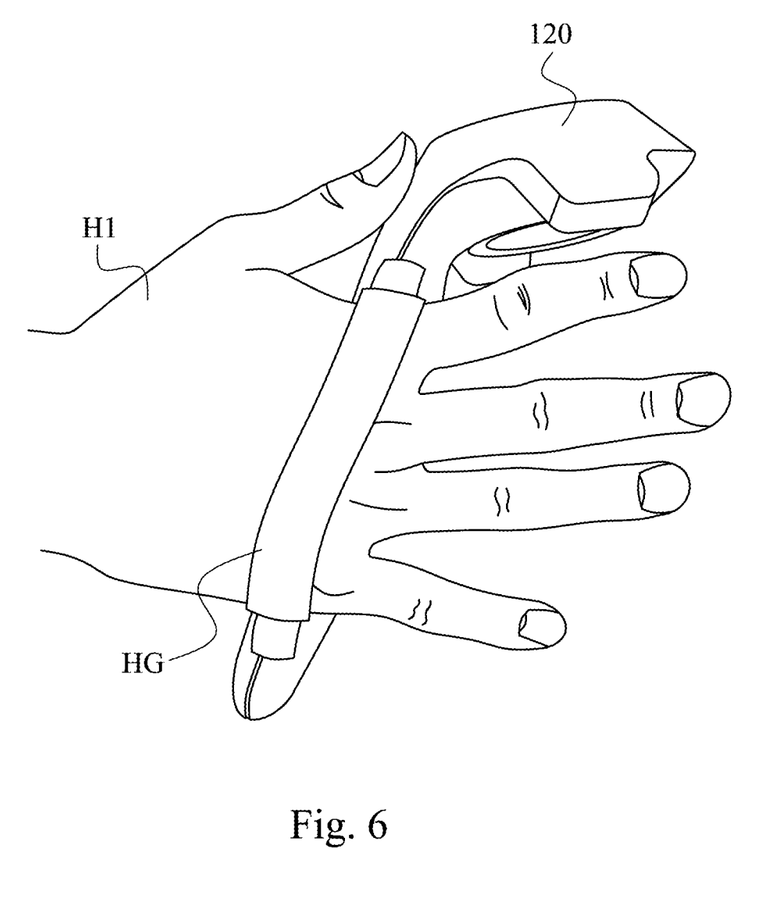
FIG. 6 is a schematic diagram of a system for detecting hand gesture according to some embodiments of present disclosure.

FIG. 6 is a schematic diagram of a system for detecting hand gesture according to some embodiments of present disclosure. As can be seen in the figure, a secure band HG is configured on a hand-held controller 120. The secure band HG is tightened on the hand H1 of user. The secure band HG is an aid provided for fixing the hand-held controller 120 on the hand H1 in case that user may need to unclasp the hand-held controller 120 with an open palm in some applications. In some embodiments, the secure band HG may be replaced by other available materials.

Figure 7A:
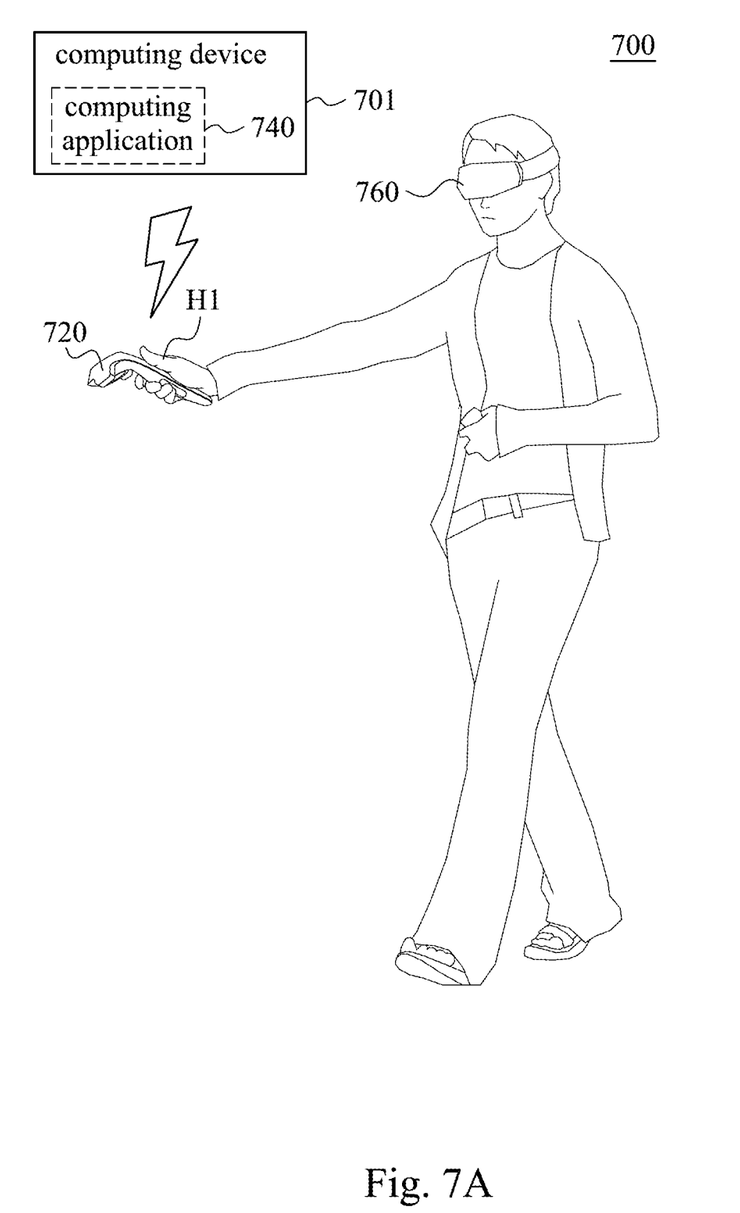
FIG. 7A is a schematic diagram of a system for detecting hand gesture and providing a simulated scenario according to some embodiments of present disclosure.

FIG. 7A is a schematic diagram of a system for detecting hand gesture and providing a simulated scenario according to some embodiments of present disclosure. The system 700 includes a hand-held device 720, a computing device 701 and a head-mounted display 760. Details and operations of the hand-held controller 720 and the computing device 701 can be referred to aforesaid embodiments of hand-held controller 120 and computing device 101 shown in FIG. 1A to FIG. 6, and not repeated here again. The computing application 740 executed by the processor of the computing device 701 basically performs same functions as the computing application 140 shown in FIG. 1A to FIG. 6. As can be seen in the figure, user is wearing a head-mounted display 760 on his head and holding a hand-held controller 720 with his hand H1. The head-mounted display 760 and the hand-held controller 720 are in communication with a computing device 701. The head-mounted display 760 is configured for displaying a simulated scenario of part of a simulated environment to user. The hand-held controller 720 comprises a plurality of finger detectors as shown in the aforementioned embodiments. The finger detectors may obtain finger positions of the hand H1 of user. The hand-held controller 720 may also comprise an inertial measurement unit to retrieve a spatial vector of the hand-held controller 720. The spatial vector and the finger positions may be sent, by the hand-held controller 720, to the computing application 740 runs on the computing device 701.

Figure 7B:
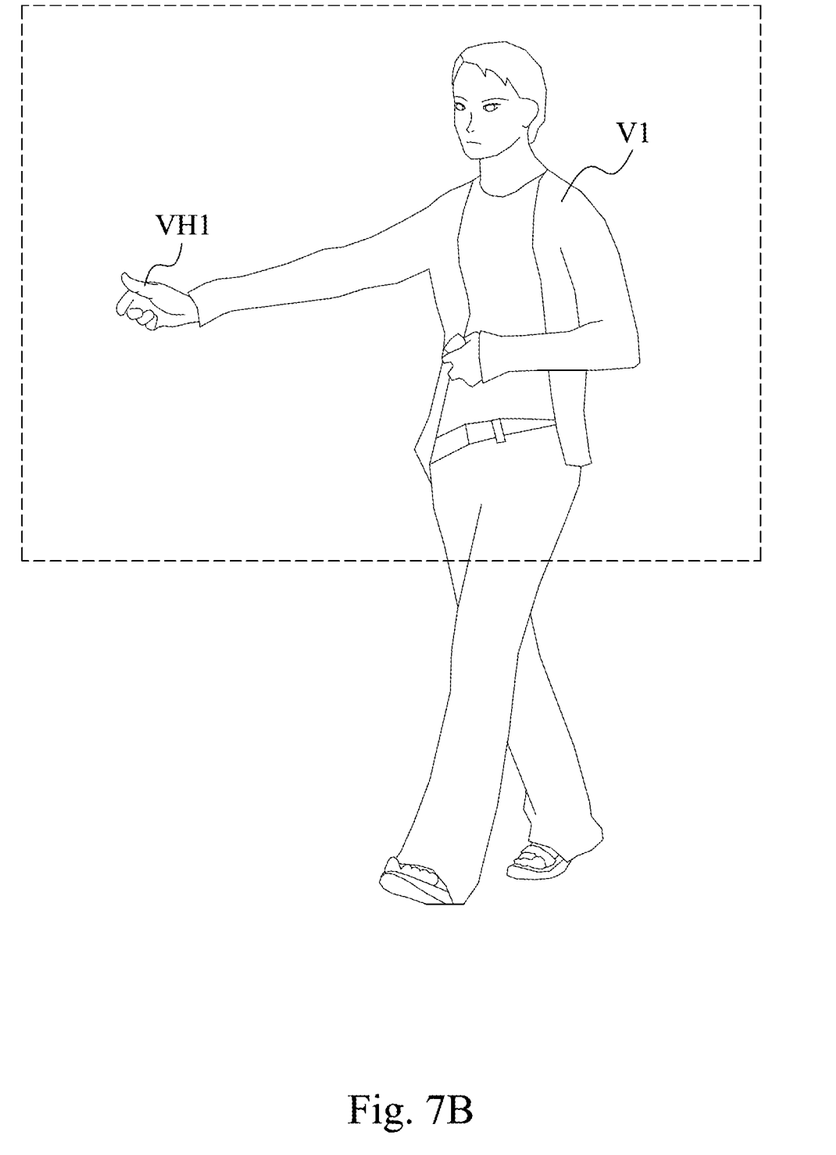
FIG. 7B is a schematic diagram of a system for detecting hand gesture and providing a simulated scenario according to the embodiments of FIG. 7A.

FIG. 7B is a schematic diagram of a system for detecting hand gesture and providing a simulated scenario according to the embodiments of FIG. 7A. As shown in FIG. 7A, the spatial vector and the finger positions are sent to the computing application 740 by the hand-held controller 720. Other applications associated with the computing application 740 may illustrate a simulated hand gesture VH1 of avatar V1 corresponding to user in the simulated scenario. As such, user may perform more complicated hand gestures in the real world, and the computing device 701 may provide simulated hand gestures of user to other users in the simulated environment. Through this approach, user interactions of simulated environments may be improved.

Figure 8:
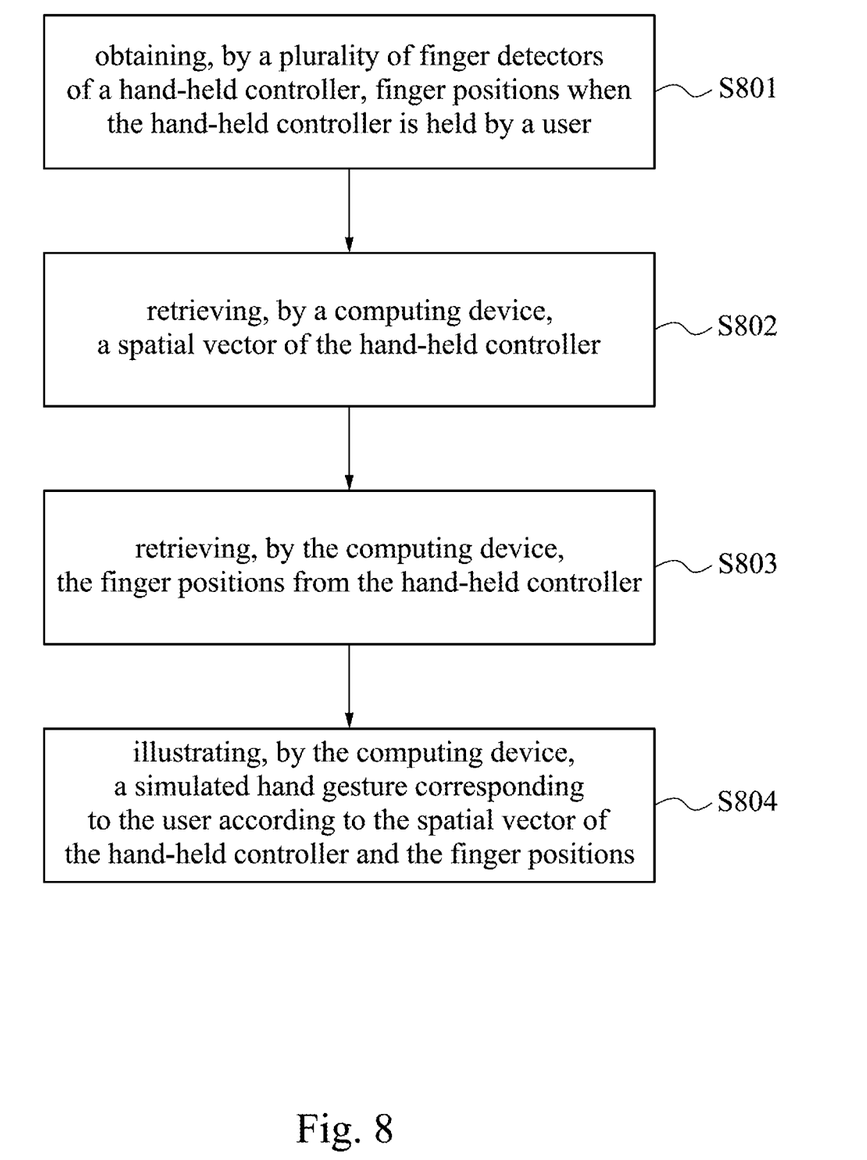
FIG. 8 is a flow chart of a method for detecting hand gesture according to some embodiments of the present disclosure.

FIG. 8 is a flow chart of a method for detecting hand gesture according to some embodiments of the present disclosure. The steps of the method will be listed and explained in detail in following segments.

Step S801: obtaining, by a plurality of finger detectors of a hand-held controller, finger positions when the hand-held controller is held by a user. As shown in FIG. 1A, FIG. 2A, FIG. 2B, FIG. 3A, FIG. 3B, FIG. 4A, FIG. 5A and FIG. 6, the hand-held controller 120 is configured to obtain finger positions of user when the hand-held controller 120 is held by the hand H1 of user.

Step S802: retrieving, by a computing device, a spatial vector of the hand-held controller. As shown in FIG. 1A, FIG. 2A, FIG. 2B, FIG. 3A, FIG. 3B, FIG. 3C, FIG. 4A, FIG. 5A and FIG. 6, in some embodiments, an inertial measurement unit may be configured on the hand-held controller 120 to retrieve the spatial vector of the hand-held controller 120. In some embodiments, the spatial vector of the hand-held controller 120 may be tracked by some individual optical detectors placed around the hand-held controller 120.

Step S803: retrieving, by the computing device, the finger positions from the hand-held controller. As shown in FIG. 1A, FIG. 2A, FIG. 2B, FIG. 3A, FIG. 3B, FIG. 3C, FIG. 4A, FIG. 5A and FIG. 6, the hand-held controller 120 may detect finger positions of user and send finger positions to the computing application 140 executed by the computing device 101. In some embodiments, the computing application 140 may be configured as an active process to retrieve finger positions from the hand-held controller 120.

Step S804: illustrating, by the computing device, a simulated hand gesture corresponding to the user according to the spatial vector of the hand-held controller and the finger positions. As shown in FIG. 1B, FIG. 4B FIG. 5B and FIG. 7B, the computing application 140 may generate information according to the spatial vector of the hand-held controller 120 and the finger positions of user. The information is provided to illustrate a simulated hand gesture VH1 corresponding to the hand H1 accordingly.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A system for detecting hand and finger gesture, comprising:
   a head-mounted display for displaying a simulated scenario;
   a hand-held controller comprising at least one finger detector, wherein the at least one finger detector is configured to obtain finger positions; and
   a computing application, executed by a processor of a computing device, configured to retrieve a spatial vector of the hand-held controller, and to retrieve the finger positions from the hand-held controller, wherein the spatial vector of the hand-held controller and the finger positions are provided to illustrate a simulated hand and finger gesture on the simulated scenario displayed by the head-mounted display, wherein the computing device is in communication with the head-mounted display and the hand-held controller,
   wherein each of the finger positions is determined by a finger distance parameter and a finger angle parameter, where the finger distance parameter is a distance from a predetermined point on a finger to the at least one finger detector, and the finger angle parameter is an angle that the predetermined point on the finger is departed from an axis extended from the at least one finger detector.

2. The system of claim 1, wherein the spatial vector of the hand-held controller comprises a position of the hand-held controller and an orientation of the hand-held controller, the hand-held controller further comprises an inertial measurement unit configured for sensing the position and the orientation of the hand-held controller.

3. The system of claim 1, wherein the spatial vector of the hand-held controller is determined by an optical detector configured to track the hand-held controller.

4. The system of claim 1, wherein the at least one finger detector comprise a touch detector, and wherein one of the finger positions is determined by detecting whether a finger contact is applied on the touch detector.

5. The system of claim 1, wherein the at least one finger detector comprise a pressure detector, and wherein one of the finger positions is determined by detecting a touch pressure on the pressure detector.

6. The system of claim 1, wherein the at least one finger detector comprise a proximity detector, wherein one of the finger positions is determined by detecting a distance between one finger and the proximity detector.

7. The system of claim 1, wherein when a number of the at least one finger detector is more than one finger detector, the more than one finger detectors are positioned on a plurality of detecting areas corresponding to fingers respectively.

8. The system of claim 7, wherein the detecting areas at least comprises a first detecting area positioned on a first lateral of the hand-held controller for detecting thumb, and a second detecting area positioned on a second lateral of the hand-held controller for detecting other fingers.

9. The system of claim 1, wherein the simulated hand and finger gesture is being illustrated along with an avatar in the simulated scenario, and wherein the simulated hand and finger gesture comprises grasping and unclasping.

10. The system of claim 1, wherein the simulated hand and finger gesture is illustrated as grasping when the finger positions are being detected as close to the at least one finger detector.

11. The system of claim 1, wherein the simulated hand and finger gesture is illustrated as unclasping when the finger positions are being detected as away from the at least one finger detector.

12. The system of claim 1, wherein the hand-held controller comprises a secure unit for fixing the hand-held controller on a hand of a user.

13. A method for detecting hand and finger gesture, comprising:
displaying a simulated scenario, by a head-mounted display;
obtaining, by at least one finger detector of a hand-held controller, finger positions;
retrieving, by a computing application executed by a processor in a computing device, a spatial vector of the hand-held controller;
retrieving, by the computing application, the finger positions from the hand-held controller; and
providing, by the computing application, to illustrate a simulated hand and finger gesture on the simulated scenario displayed by the head-mounted display according to the spatial vector of the hand-held controller and the finger positions, wherein the computing device is in communication with the head-mounted display and the hand-held controller,
wherein each of the finger positions is determined by a finger distance parameter and a finger angle parameter, where the finger distance parameter is a distance from a predetermined point on a finger to the at least one finger detector, and the finger angle parameter is an angle that the predetermined point on the finger is departed from an axis extended from the at least one finger detector.

14. The method of claim 13, wherein the spatial vector of the hand-held controller comprises a position of the hand-held controller and an orientation of the hand-held controller, the hand-held controller further comprises an inertial measurement unit configured for sensing the position and the orientation of the hand-held controller.

15. The method of claim 13, wherein the spatial vector of the hand-held controller is determined by an optical detector configured to track the hand-held controller.

16. The method of claim 13, wherein the at least one finger detector comprise a touch detector, and wherein one of the finger positions is determined by detecting whether a finger contact being applied on the touch detector.

17. The method of claim 13, wherein the at least one finger detector comprise a pressure detector, and wherein one of the finger positions is determined by detecting a touch pressure on the pressure detector.

18. The method of claim 13, wherein the at least one finger detector comprise a proximity detector, wherein one of the finger positions is determined by detecting a distance between one finger and the proximity detector.

19. The method of claim 13, wherein the simulated hand and finger gesture is being illustrated along with an avatar in the simulated scenario, and wherein the simulated hand and finger gesture comprises grasping and unclasping.

* * * * *